(12) United States Patent
Buchholz et al.

(10) Patent No.: US 9,080,099 B2
(45) Date of Patent: Jul. 14, 2015

(54) FLUORINE-BRIDGED ASSOCIATIONS FOR OPTOELECTRONIC APPLICATIONS

(75) Inventors: Herwig Buchholz, Frankfurt (DE); Susanne Heun, Bad Soden (DE); Thomas Eberle, Landau (DE)

(73) Assignee: Merck Patent GmbH, Darmstadt (DE)

( * ) Notice: Subject to any disclaimer, the term of this patent is extended or adjusted under 35 U.S.C. 154(b) by 333 days.

(21) Appl. No.: 13/001,910

(22) PCT Filed: Aug. 6, 2009

(86) PCT No.: PCT/EP2009/005707
§ 371 (c)(1),
(2), (4) Date: Dec. 29, 2010

(87) PCT Pub. No.: WO2010/025802
PCT Pub. Date: Mar. 11, 2010

(65) Prior Publication Data
US 2011/0095283 A1 Apr. 28, 2011

(30) Foreign Application Priority Data
Sep. 3, 2008 (DE) .......................... 10 2008 045 663

(51) Int. Cl.
| | |
|---|---|
| *H01L 51/54* | (2006.01) |
| *H01L 51/50* | (2006.01) |
| *C08G 79/08* | (2006.01) |
| *C09K 11/06* | (2006.01) |
| *H01B 1/12* | (2006.01) |
| *C08G 61/10* | (2006.01) |
| *C08G 61/12* | (2006.01) |
| *H01L 51/00* | (2006.01) |

(52) U.S. Cl.
CPC .............. *C09K 11/06* (2013.01); *H01L 51/0034* (2013.01); *C08G 61/10* (2013.01); *C08G 61/12* (2013.01); *C08G 2261/146* (2013.01); *C08G 2261/3142* (2013.01); *C08G 2261/3162* (2013.01); *C08G 2261/3221* (2013.01); *C09K 2211/1416* (2013.01); *C09K 2211/185* (2013.01); *H01L 51/0039* (2013.01); *H01L 51/5016* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 2002/0106531 | A1* | 8/2002 | Naito | 428/690 |
| 2004/0135131 | A1* | 7/2004 | Treacher et al. | 252/582 |
| 2004/0185300 | A1* | 9/2004 | Hatwar et al. | 428/690 |
| 2005/0238916 | A1* | 10/2005 | Igarashi | 428/690 |
| 2006/0163562 | A1* | 7/2006 | Boerner | 257/40 |
| 2006/0228576 | A1* | 10/2006 | Burroughes et al. | 428/690 |
| 2010/0108989 | A1 | 5/2010 | Busing et al. | |

FOREIGN PATENT DOCUMENTS

| | | |
|---|---|---|
| EP | 1220341 A2 | 7/2002 |
| EP | 1492173 A2 | 12/2004 |
| JP | 2002280183 A | 9/2002 |
| JP | 2008525534 A | 7/2008 |
| WO | WO 2005059951 A2 * | 6/2005 |

* cited by examiner

*Primary Examiner* — Andrew K Bohaty
(74) *Attorney, Agent, or Firm* — Drinker Biddle & Reath LLP

(57) ABSTRACT

The present invention relates to a fluorine-bridged associate consisting of an oligomer or polymer containing fluorine radicals which are bonded to the oligomer or polymer backbone, and up to three types of functional units in the backbone which differ with respect to function and are selected from the group consisting of a hole-transport and/or hole-injection unit, an electron-transport and/or electron-injection unit and an emitter unit, and one to three types of compounds containing a fluorine radical which differ with respect to function and are selected from a hole-transport and/or hole-injection unit, an electron-transport and/or electron-injection unit and an emitter unit, and to an opto-electronic device in which the fluorine-bridged associate is employed.

6 Claims, 1 Drawing Sheet

FLUORINE-BRIDGED ASSOCIATIONS FOR OPTOELECTRONIC APPLICATIONS

RELATED APPLICATIONS

This application is a national stage application (under 35 U.S.C. §371) of PCT/EP2009/005707, filed Aug. 6, 2009, which claims benefit of German Application No. 10 2008 045 663.2, filed Sep. 3, 2008.

FIELD OF THE INVENTION

The present invention relates to a fluorine-bridged associate consisting of an oligomer or polymer containing fluorine radicals which are bonded to the oligomer or polymer backbone, and up to three types of functional units in the backbone which differ with respect to function and are selected from the group consisting of a hole-transport and/or hole-injection unit, an electron-transport and/or electron-injection unit and an emitter unit, and one to three types of compounds containing a fluorine radical which differ with respect to function and are selected from a hole-transport and/or hole-injection unit, an electron-transport and/or electron-injection unit and an emitter unit, and to an opto-electronic device in which the fluorine-bridged associate is employed.

BACKGROUND OF THE INVENITON

Electronic devices which comprise organic, organometallic and/or polymeric semiconductors are being used ever more frequently in commercial products or are just about to be introduced onto the market. Examples which may be mentioned here are organic-based charge-transport materials (for example hole transporters based on triarylamine) in photocopiers and organic or polymeric light-emitting diodes (OLED=organic light-emitting diode or PLED=polymeric light-emitting diode) in display devices. Organic solar cells (O-SCs), organic field-effect transistors (O-FETs), organic thin-film transistors (O-TFTs), organic integrated circuits (O-ICs), organic optical amplifiers and organic laser diodes (O-lasers) are at an advanced stage of development and may achieve major importance in the future.

Many of these electronic or opto-electronic devices have, irrespective of the particular application, the following general layer structure, which can be adapted for the particular application:
(1) substrate,
(2) electrode, which is frequently metallic or inorganic, but may also be built up from organic or polymeric conductive materials,
(3) optionally one or more charge-injection layer(s) or interlayer(s) for compensation of unevenness of the electrode ("planarisation layer"), which is (are) frequently formed from one or more conductive, doped polymer(s),
(4) at least one layer of an organic semiconductor,
(5) optionally one or more further charge-transport or charge-injection or charge-blocking layer(s),
(6) counterelectrode in which the materials mentioned under (2) are employed,
(7) encapsulation.

The present invention is directed in particular, but not exclusively, to organic light-emitting diodes (OLEDs), which, in the case of the use of polymeric materials, are often also known as polymeric light-emitting diodes (PLEDs). The arrangement described above represents the general structure of an opto-electronic device, where various layers may be combined, meaning that, in the simplest case, an arrangement consists of two electrodes, between which an organic layer is located. In this case, the organic semiconductor layer takes on all functions, including the emission of light. A system of this type is described, for example, in WO 90/13148 A1 on the basis of poly(p-phenylenes).

The polymers for opto-electronic applications which can be used in the organic semiconductor layer mentioned above are generally polymers having a conjugated or partially conjugated main chain, where the polymer backbone itself plays an important role with respect to the opto-electronic properties, side-chain polymers, such as, for example, PVK (poly-N-vinyl-carbazole), in which the functionality is achieved by a transport unit which is chemically bonded to the backbone, or neutral polymers, which merely provide the film-formation properties (as is known of organic photoreceptors, in which hole-transport materials are typically dissolved in polycarbonate). All these approaches are in principle viable and are described in the literature.

Conjugated polymers for opto-electronic applications, such as, for example, polyfluorenes, polyindenofluorenes, polyphenylenes and polyphenylenevinylenes, have proven suitable for OLED applications and organic photovoltaic applications. The lifetime of the devices produced from these polymers has constantly increased over the years, but progress was slower than in the case of "evaporated small molecule" devices (SMOLEDs). The reason for this is attributable to the fact that functionalities necessary in a multilayered SMOLED, such as, for example, hole transport, electron transport, recombination and emission, can be separated into respective layers, whereas all these functionalities are combined in one layer in the partially or fully conjugated polymer. Conjugated polymers are at present the best option of the three mentioned above, since, in particular, stable electron-transport molecules are not readily available and consequently cannot be incorporated easily into a neutral matrix. This transport part is usually taken on by the backbone, but is apparently not as stable as in SMOLEDs. In addition, conjugated units are connected to one another and therefore shift the HOMO-LUMO separation in the direction of lower energies, which limits the available color range for conjugated polymers (a deep blue is virtually impossible in the case of a fully conjugated polymer). Owing to the problems with respect to the limitation of the lifetime and the band separation, the other two approaches appear to be more interesting, since they are more similar to the case of the small molecule. However, random mixing of electron- and hole-transport molecules in a matrix usually results in charge-transfer states, which usually quench the electroluminescence.

On the other hand, side-chain polymers, such as, for example, PVK, have a neutral, PE-like backbone and are therefore prepared either by free-radical, cationic, anionic or coordinative polymerisation. However, it is not simple to control these processes since, in particular, the tolerance with respect to free-radical or charged end groups in OLED devices is rather low (ppm level). In addition, functional units can come quite close since the polymerisation is a random process, meaning that charge-transfer complexes or dimer formation (as is known of PVK) represent(s) a significant hurdle with respect to efficiency and a long life.

In view of the prior art described above, the object of the present invention consisted in providing novel opto-electronically functional oligomers or polymers for opto-electronic applications, in particular for OLED applications, which do not have the above-mentioned disadvantages of known approaches, and an opto-electronic device which comprises the novel, opto-electronically functional oligomers or polymers.

This object is achieved in accordance with the invention by a fluorine-bridged associate according to Claim 1 and an opto-electronic device according to Claim 5. Advantageous refinements and embodiments of the present invention are indicated in the dependent claims.

BRIEF SUMMARY OF THE INVENTION

In accordance with the invention, a fluorine-bridged associate is provided which consists of
- an oligomer or polymer containing fluorine radicals which are bonded to the oligomer or polymer backbone, and up to three types, preferably up to two types, of functional units in the backbone which differ with respect to function and are selected from the group consisting of a hole-transport and/or hole-injection unit, an electron-transport and/or electron-injection unit and an emitter unit, and
- one to three types of compounds containing a fluorine radical which differ with respect to function and are selected from a hole-transport and/or hole-injection unit, an electron-transport and/or electron-injection unit and an emitter unit.

The fluorine-bridged associate according to the invention has an oligomer or polymer backbone to which fluorine radicals, which can be selected from the fluorine radicals mentioned below, are bonded. "Backbone" in the sense of the present invention means that the fluorine radicals may be located directly on the polymer or oligomer backbone or in optional side chains of the polymer or oligomer. Furthermore, the oligomer or polymer backbone (the above definition also applies here) optionally contains up to three types of functional units for opto-electronic applications with differ with respect to function, such as, for example, a hole-transport and/or hole-injection unit, an electron-transport and/or electron-injection unit and an emitter unit. Examples of these units are likewise described below.

The basic idea of the present invention consists in bonding one to three types of compounds containing a fluorine radical which differ with respect to function to the oligomer or polymer backbone by means of fluorophilic interactions, giving a fluorine-bridged associate which has at least some of the functions or even all the functions which are necessary for an organic layer, for example in an OLED, i.e. hole transport and/or hole injection, electron transport and/or electron injection, and emission. These compounds containing a fluorine radical may be selected in accordance with the invention from the group consisting of a hole-transport and/or hole-injection unit, an electron-transport and/or electron-injection unit and an emitter unit, where examples are likewise described below.

"An emitter unit" is equivalent to "a plurality of emitter units". In general, a term in the singular, such as "a" or "an", in the present invention likewise also encompasses a plurality thereof, unless expressly mentioned otherwise.

Compared with the prior art, the fluorine-bridged associate of the present invention gives rise to the advantage that the functional compounds having opto-electronic functions can be bonded to the oligomer or polymer back-bone (or the side chain) without chemical reactions and can be positioned at the desired site on the oligomer or polymer backbone (or the side chain) and at the desired separation therefrom.

In accordance with the invention, for example if a hole-transport unit is present in the oligomer or polymer backbone, an electron-transport and/or electron-injection unit containing a fluorine radical is bonded to or held on the oligomer or polymer backbone by a fluorine radical at the desired site at a suitable separation from the hole-transport unit, giving the best-possible performance of an opto-electronic device which comprises the fluorine-bridged associate of the present invention.

Interactions which reduce the lifetime and efficiency of an opto-electronic device which comprises the fluorine-bridged associate of the present invention can be avoided in this way.

Various possible arrangements of the functional units in the oligomer or polymer backbone and the compounds containing a fluorine radical which differ with respect to function are shown in the preferred embodiments described below.

In a preferred embodiment, the oligomer or polymer backbone does not contain a functional unit and the fluorine-bridged associate contains three types of compounds containing a fluorine radical, as mentioned above.

DETAILED DESCRIPTION OF THE INVENTION

Figure 1:
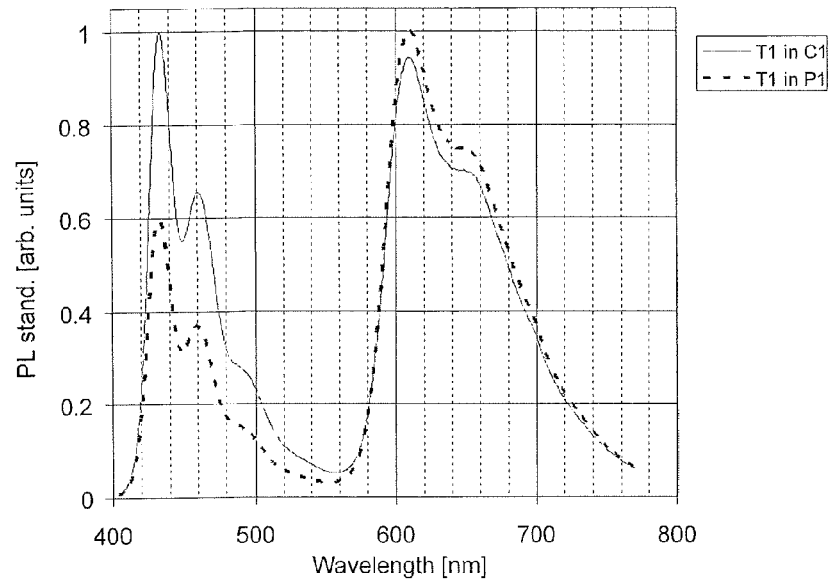
FIG. 1 shows the spectra of T1 in P1 and T1 in C1.

In a further preferred embodiment, the oligomer or polymer backbone contains a hole-transport and/or hole-injection unit and the fluorine-bridged associate preferably contains an electron-transport and/or electron-injection unit and/or an emitter unit as compound(s) containing a fluorine radical.

In a further embodiment, the oligomer or polymer backbone contains an electron-transport and/or electron-injection unit and the fluorine-bridged associate contains a hole-transport and/or hole-injection unit and/or an emitter unit as compound(s) containing a fluorine radical.

In a further embodiment, the oligomer or polymer backbone contains an emitter unit and the fluorine-bridged associate contains a hole-transport and/or hole-injection unit and/or an electron-transport and/or electron-injection unit as compound(s) containing a fluorine radical.

In yet a further preferred embodiment, the oligomer or polymer backbone contains a hole-transport and/or hole-injection unit and an electron-transport and/or electron-injection unit and the fluorine-bridged associate contains one (or more) emitter unit(s) as compound(s) containing a fluorine radical.

In yet a further preferred embodiment, the oligomer or polymer backbone contains a hole-transport and/or hole-injection unit and an emitter unit and the fluorine-bridged associate contains an electron-transport and/or electron-injection unit as compound(s) containing a fluorine radical.

In yet a further preferred embodiment, the oligomer or polymer backbone contains an electron-transport and/or electron-injection unit and an emitter unit and the fluorine-bridged associate contains a hole-transport and/or hole-injection unit as compound(s) containing a fluorine radical.

In the preferred embodiments mentioned above, the functions of the fluorine-bridged associate of the present invention can be customised with respect to the particular application.

In a further preferred embodiment, the oligomer or polymer is a non-conjugated or partially conjugated homo- or co-oligomer or -polymer.

Conjugated oligomers or polymers in the sense of the present invention are oligomers or polymers which contain principally $sp^2$-hybridised (or also sp-hybridised) carbon atoms in the main chain, which may also be replaced by corresponding heteroatoms. In the simplest case, this means the alternating presence of double and single bonds in the main chain. The term "principally" means that naturally occurring defects which result in conjugation interruptions nevertheless fall under the term "conjugated oligomer or polymer". However, this does not mean oligomers or polymers which intentionally contain relatively large amounts of inserted non-conjugated segments. Furthermore, a polymer or oligomer is likewise referred to as conjugated in the present invention if, for example, arylamine units, arylphosphine units and/or heterocycles (i.e. conjugation via N, O or S atoms) and/or organometallic complexes (i.e. conjugation via the metal atom) are located in the main chain.

By contrast, units such as, for example, simple (thio)ether bridges, ester links, amide or imide links are defined as non-conjugated segments in the present invention. A partially conjugated oligomer or polymer in the sense of the present invention is intended to be taken to mean an oligomer or polymer which either contains relatively long conjugated segments which are interrupted by non-conjugated segments in the main chain, or which contains relatively long conjugated segments in the side chains of a polymer which is non-conjugated in the main chain.

In particular, the oligomer or polymer in accordance with the present invention is a conjugated homo- or co-oligomer or -polymer, where the co-oligomer or -polymer in a further preferred embodiment is a random co-oligomer or -polymer, an alternating co-oligomer or -polymer or a block co-oligomer or -polymer.

The terms "random", "alternating" or "block" in connection with copolymers are known to the person skilled in the art and do not have to be explained further here. The use of a corresponding copolymer offers the person skilled in the art the possibility of arranging the fluorine radicals bonded to the oligomer or polymer backbone in the desired sequence and at the desired separation in a particularly simple manner, so that a fluorine-bridged associate in which the functional compounds containing a fluorine radical are arranged in the desired sequence and at the desired separation is obtained in accordance with the invention.

In accordance with the invention, the oligomer preferably contains 3 to 9 recurring units and the polymer preferably contains more than 9 (i.e. 10 or more) recurring units.

The fluorine radicals which can be employed in accordance with the invention, i.e. the fluorine radicals which are bonded to the oligomer or polymer backbone and the functional compounds, preferably have the general formula $C_xH_yF_z$, where $x \geq 0$, $y \geq 0$ and $z \geq 1$, and no, one or more $CH_2$ groups, which may also be adjacent, may be replaced by O, S, Se, Te, $Si(R^1)_2$, $Ge(R^1)_2$, $NR^1$, $PR^1$, CO, $P(R^1)O$, where $R^1$ is on each occurrence, identically or differently, a straight-chain or branched or cyclic alkyl, alkenyl, alkynyl, aryl, arylalkyl, arylalkenyl, arylalkynyl, heteroaryl or hetero-alkyl group, where, in addition, one or more non-adjacent C atoms in the non-aromatic moieties may be replaced by O, S, CO, COO, OCO, with the proviso that two radicals $R^1$ may also form ring systems with one another.

In a particularly preferred embodiment of the present invention, the fluorine radicals are selected from the group consisting of F, $CF_3$, $C_2F_5$, $CF_3(CH_2)_aS$, $CF_3CF_2S$ or $(CF_3-(CH_2)_a)_2N$, where a preferably represents an integer from 0 to 5.

In the fluorine-bridged associate, the oligomer or polymer contains a spacer Sp between the oligomer or polymer backbone and the fluorine radicals. Spacers Sp which can be employed are all groups which are known to the person skilled in the art for this purpose. Sp is preferably a linear or branched alkylene group having 1 to 20 C atoms, particularly preferably having 1 to 12 C atoms, in which one or more non-adjacent $CH_2$ groups may be replaced by —O—, —S—, —NH—, —N($CH_3$)—, —CO—, —O—CO—, —S—CO—, —O—COO—, —CO—S—, —CO—O—, —CH(halogen)-, —CH(CN)—, —CH═CH— or —C≡C—.

Conventional spacer groups are, for example, —$(CH_2)_o$—, —$(CH_2CH_2O)_p$—$CH_2CH_2$—, —$CH_2CH_2$—S—$CH_2CH_2$— or —$CH_2CH_2$—NH—$CH_2CH_2$—, where o=2 to 12 and p=1 to 3.

Preferred spacer groups are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyliminoethylene, 1-methylalkylene, ethenylene, propenylene or butenylene.

Sp particularly preferably denotes an alkyl or alkoxy group having 2 to 8 C atoms. Straight-chain groups are particularly preferred here.

The presence of the spacer Sp between the oligomer or polymer backbone and the fluorine radicals enables a functional compound containing a fluorine radical, such as, for example, a hole conductor, an electron conductor and an emitter, to be kept at a distance from the oligomer or polymer back-bone, so that optimum performance of the opto-electronic device comprising the fluorine-bridged associate is obtained. The spacer can be adjusted to a suitable length by the person skilled in the art without excessive experimentation.

In a particularly preferred embodiment of the present invention, the emitter is a triplet emitter. Triplet emitters in particular are frequently quenched by conjugated regions in the oligomer or polymer backbone, which reduce the band separation. By positioning a triplet emitter at a site on the oligomer or polymer backbone which is sufficiently remote from the conjugated regions, such quenching can be prevented, enabling the performance of a corresponding opto-electronic device in which the fluorine-bridged associate is present to be increased in accordance with the invention.

Specific examples of the functional units (recurring units) of the oligomer or polymer which can be employed in the fluorine-bridged associate according to the invention are indicated below. Furthermore, further recurring units are indicated which are employed either as oligomer or polymer backbone units in the oligomers or polymers of the fluorine-bridged associates according to the invention or provide them with further special functions.

Preferred polymers or fluorine-containing polymers (or polymers containing fluorinated or perfluorinated side groups) in the sense of the present invention are polymers which are conjugated or partially conjugated as already described above and which contain $sp^2$-hybridised carbon atoms in the main chain, which may also be replaced by corresponding heteroatoms. Furthermore, the term conjugated is likewise used in the sense of the present invention if, for example, arylamine units and/or certain heterocycles (i.e. conjugation via N, O or S atoms) and/or organometallic complexes (i.e. conjugation via the metal atom) are located in the main chain. Typical representatives of conjugated polymers as can be used, for example, in PLEDs or generally in O-SCs are poly-para-phenylenevinylenes (PPVs), polyfluorenes, polyspirobifluorenes, polyphenanthrenes, polydihydrophenanthrenes, polyindenofluorenes, systems which are based in the broadest sense on poly-p-phenylenes (PPPs), and derivatives of these structures, in particular derivatives which contain fluorine-containing groups.

Particular preference is given in accordance with the invention to polymers which contain further structural elements and should thus be referred to as copolymers. Particular reference is also made here to the relatively extensive lists of possible structural elements in WO 02/077060 A1, WO 2005/014689 A2 and the references cited in these specifications. These further structural units can originate, for example, from the classes described below, where it is pointed out that these structural units should be taken to mean in accordance with the invention both recurring units of a polymer (i.e. in the backbone or side chain of the polymer or oligomer), and also compounds containing fluorine radicals employed in accordance with the invention. In the latter case, the bonds (usually drawn in dashed form) which represent a link to the next recurring unit of a polymer or oligomer are not present, but instead only a fluorine radical, preferably as defined above.

Group 1: structural units which represent the polymer backbone.

Group 2: structural units which influence the hole-injection and/or -transport properties of the polymers or serve as hole-injection and/or -transport unit.

Group 3: structural units which influence the electron-injection and/or -transport properties of the polymers or serve as electron-injection and/or -transport unit.

Group 4: structural units which have combinations of individual units from group 2 and group 3.

Group 5: structural units which influence the morphological properties and/or the emission colour of the resultant polymers or fluorine-bridged associate.

Group 6: structural units which modify the emission characteristics to such an extent that electrophosphorescence can be obtained instead of electrofluorescence.

Group 7: structural units which improve the transfer from the singlet state to the triplet state.

Suitable and preferred units for the groups mentioned above are described below, where these preferably contain the fluorine-containing groups defined in accordance with the invention.

Group 1—structural units which represent the polymer backbone:

Preferred units from group 1 are, in particular, those which contain aromatic or carbocyclic structures having 6 to 40 C atoms. Suitable and preferred units are, inter alia, fluorene derivatives, as disclosed, for example, in EP 0842208, WO 99/54385, WO 00/22027, WO 00/22026 and WO 00/46321, indenofluorene derivatives, furthermore spirobifluorene derivatives, as disclosed, for example, in EP 0707020, EP 0894107 and WO 03/020790, phenanthrene derivatives or dihydrophenanthrene derivatives, as disclosed, for example, in WO 2005/014689. It is also possible to use a combination of two or more of these monomer units, as described, for example, in WO 02/077060. Preferred units for the polymer backbone are, in particular, spirobifluorene, indenofluorene, phenanthrene and dihydrophenanthrene derivatives.

Particularly preferred units from group 1 are divalent units of the following formulae, in which the dashed lines denote the link to the adjacent units:

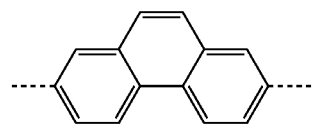
(I)

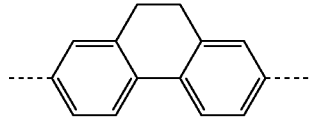
(II)

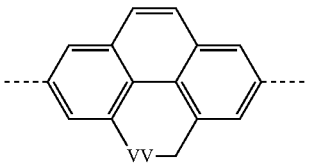
(IIa)

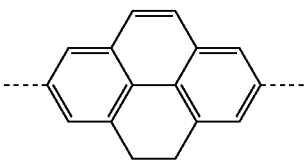
(IIb)

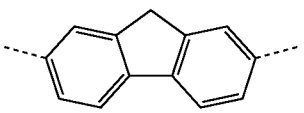
(IVa)

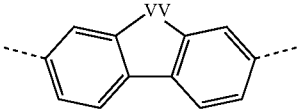
(IVb)

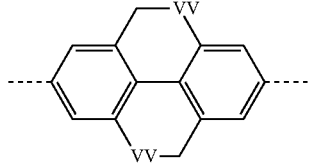
(V)

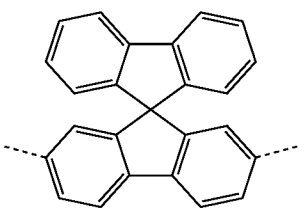
(VIa)

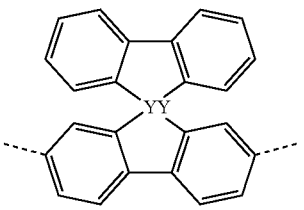
(VIb)

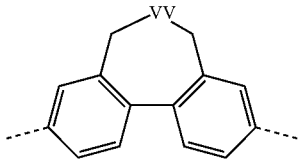
(VII)

-continued

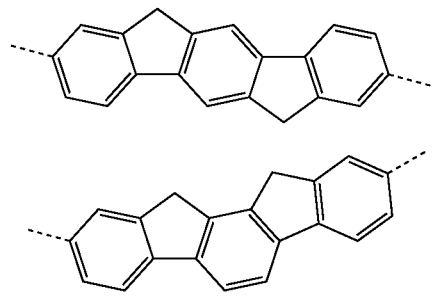
(VIII)

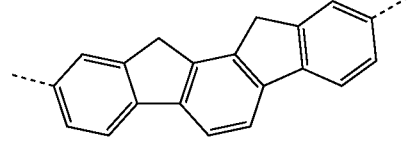
(IX)

in which the individual radicals have the following meanings:

YY is Si or Ge,

VV is O, S or Se, and where the various formulae may also additionally be substituted by one or more substituents $R^2$ in the free positions, and $R^2$ has the following meaning:

$R^2$ is on each occurrence, identically or differently, H, a straight-chain, branched or cyclic alkyl or alkoxy chain having 1 to 22 C atoms, in which, in addition, one or more non-adjacent C atoms may be replaced by O, S, CO, O—CO, CO—O or O—CO—O, where, in addition, one or more H atoms may be replaced by fluorine, an aryl or aryloxy group having 5 to 40 C atoms, in which, in addition, one or more C atoms may be replaced by O, S or N, which may also be substituted by one or more non-aromatic radicals $R^2$, or F, CN, $N(R^3)_2$ or $B(R^3)_2$; and $R^3$ is on each occurrence, identically or differently, H, a straight-chain, branched or cyclic alkyl chain having 1 to 22 C atoms, in which, in addition, one or more non-adjacent C atoms may be replaced by O, S, CO, O—CO, CO—O or O—CO—O, where, in addition, one H atoms may be replaced by fluorine, or an optionally substituted aryl group having 5 to 40 C atoms, in which, in addition, one or more C atoms may be replaced by O, S or N.

Group 2—structural units which influence the hole-injection and/or -transport properties of the polymers or serve as compounds containing fluorine radicals in the sense of the present invention:

These are generally aromatic amines or electron-rich heterocycles, such as, for example, substituted or unsubstituted triarylamines, benzidines, tetraarylene-para-phenylenediamines, phenothiazines, phenoxazines, dihydrophenazines, thianthrenes, dibenzo-p-dioxins, phenoxathiynes, carbazoles, azulenes, thiophenes, pyrroles, furans and further O-, S- or N-containing heterocycles having a high HOMO (HOMO=highest occupied molecular orbital). However, triarylphosphines, as described, for example, in WO 2005/017065 A1, are also suitable here.

Particularly preferred units from group 2 are divalent units of the following formulae, in which, in the case where these units are part of an oligomer or polymer, the dashed lines denote the link to the adjacent units:

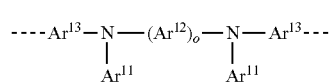
(X)

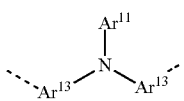
(XI)

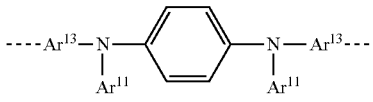
(XII)

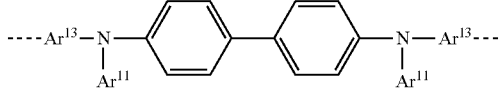
(XIII)

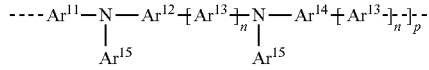
(XIV)

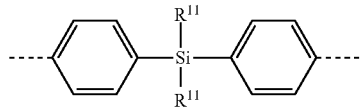
(XV)

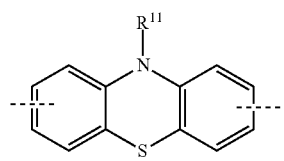
(XVI)

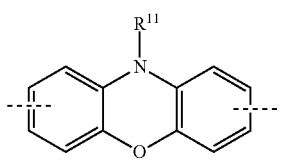
(XVII)

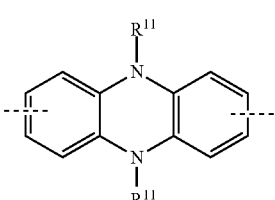
(XVIII)

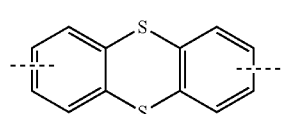
(XIX)

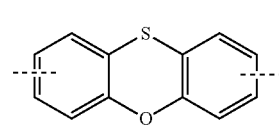
(XX)

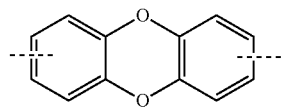
(XXI)

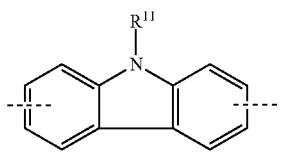
(XXII)

-continued

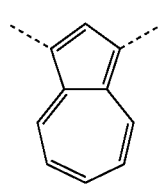 (XXIII)

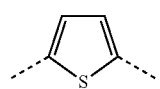 (XXIV)

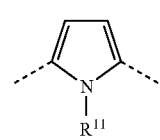 (XXV)

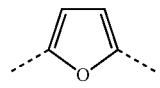 (XXVI)

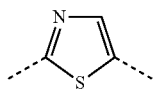 (XXVII)

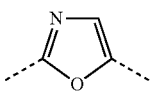 (XXVIII)

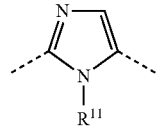 (XXIX)

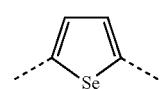 (XXX)

where $R^{11}$ has one of the meanings indicated above for $R^2$, the various formulae may also additionally be substituted by one or more substituents $R^{11}$ in the free positions, and the symbols and indices have the following meanings:

n is, identically or differently on each occurrence, 0, 1 or 2, p is, identically or differently on each occurrence, 0, 1 or 2, preferably 0 or 1, o is, identically or differently on each occurrence, 1, 2 or 3, preferably 1 or 2, $Ar^{11}$, $Ar^{13}$ are on each occurrence, identically or differently, an aromatic or heteroaromatic ring system having 2 to 40 C atoms, which may be mono- or polysubstituted by $R^{11}$ or also unsubstituted; the possible substituents $R^{11}$ here can potentially be in any free position, $Ar^{12}$, $Ar^{14}$ are on each occurrence, identically or differently, $Ar^{11}$, $Ar^{13}$ or a substituted or unsubstituted stilbenylene or tolanylene unit, $Ar^{15}$ is, identically or differently on each occurrence, either a system as defined for $Ar^{11}$ or an aromatic or heteroaromatic ring system having 9 to 40 aromatic atoms (C atoms or heteroatoms), which may be mono- or polysubstituted by $R^{11}$ or unsubstituted and which consists of at least two condensed rings; the possible substituents $R^{11}$ here can potentially be in any free position.

Group 3—structural units which influence the electron-injection and/or -transport properties of the polymers or compounds containing fluorine radicals in the sense of the present invention which do this job:

These are generally electron-deficient aromatic or heterocyclic compounds, such as, for example, substituted or unsubstituted pyridines, pyrimidines, pyridazines, pyrazines, pyrenes, perylenes, anthracenes, benzanthracenes, oxadiazoles, quinolines, quinoxalines, phenazines, benzimidazoles, ketones, phosphine oxides, sulfoxides or triazines, but also compounds such as triarylboranes and further O-, S- or N-containing heterocycles having a low LUMO (LUMO=lowest unoccupied molecular orbital), and benzophenones and derivatives thereof, as disclosed, for example, in WO 05/040302.

Particularly preferred units from group 3 are divalent units of the following formulae, in which, in the case where these units are part of an oligomer or polymer, the dashed lines denote the link to the adjacent units:

 (XXXI)

 (XXXII)

 (XXXIII)

 (XXXIV)

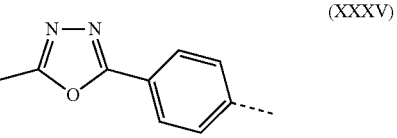 (XXXV)

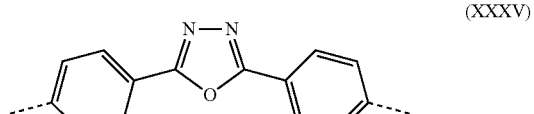

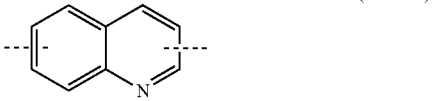 (XXXVI)

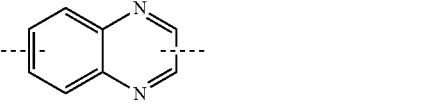 (XXXVII)

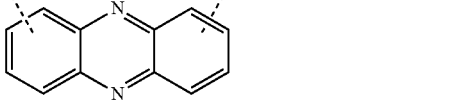 (XXXVIIIa)

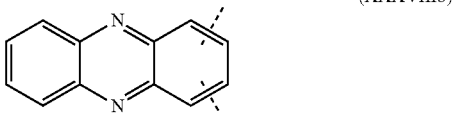 (XXXVIIIb)

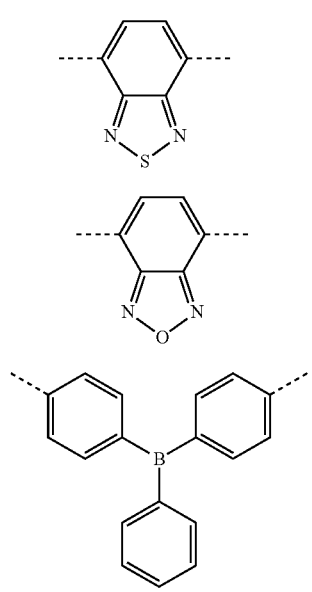

(XXXIX)

(XL)

(XLI)

where the various formulae may be substituted by one or more substituents $R^{11}$ as defined above in the free positions.

Group 4—structural units which have combinations of individual units from group 2 and group 3:

It is also possible for the polymers or fluorine-bridged associate according to the invention to contain structural units in which structures which increase the hole mobility and structures which increase the electron mobility are bonded directly to one another or to contain structures which can do both. However, some of these units shift the emission colour into the yellow or red. Their use in the optoelectronic device according to the invention for the generation of blue or green emission is therefore less preferred.

If such units from group 4 are present in the polymers, they are preferably selected from divalent units of the following formulae, in which, in the case where these units are part of an oligomer or polymer, the dashed lines denote the link to the adjacent units:

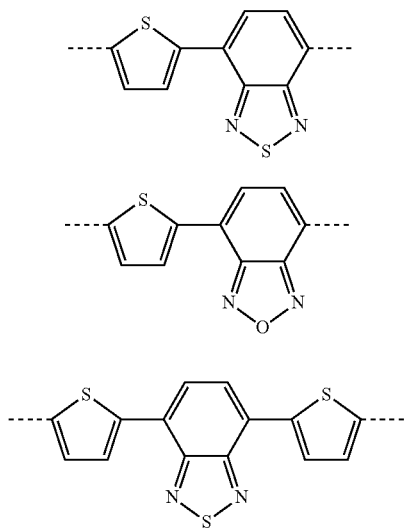

(XLII)

(XLIII)

(XLIV)

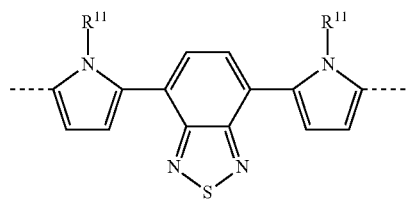

(XLV)

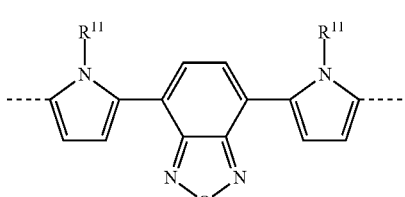

(XLVI)

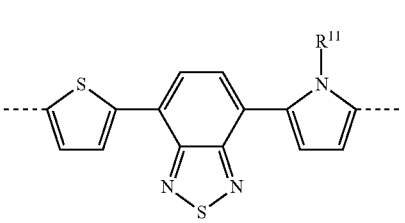

(XLVII)

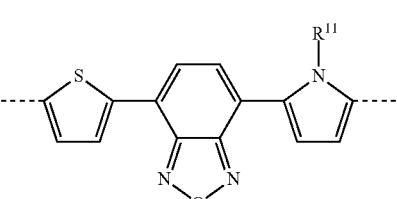

(XLVIII)

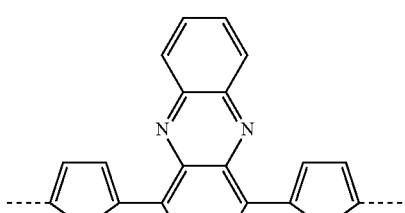

(XLIX)

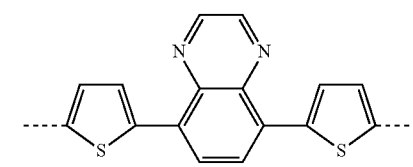

(L)

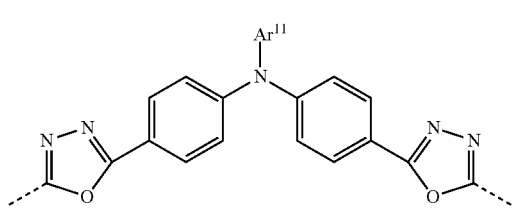

(LI)

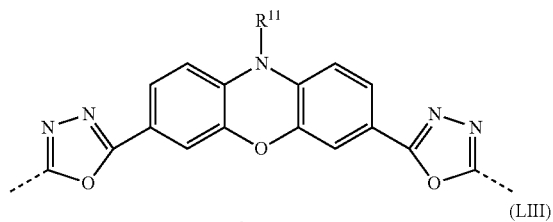
(LII)

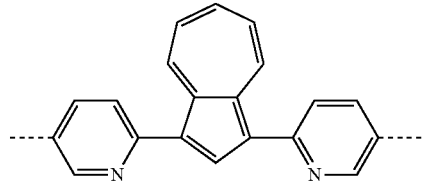
(LIII)

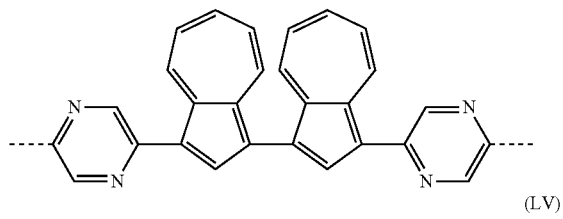
(LIV)

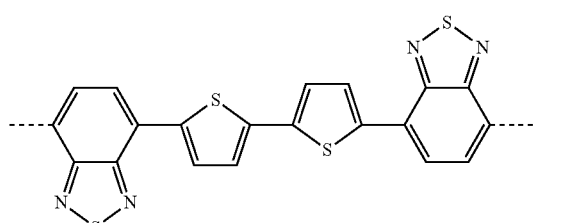
(LV)

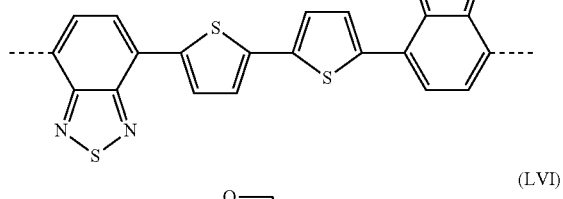
(LVI)

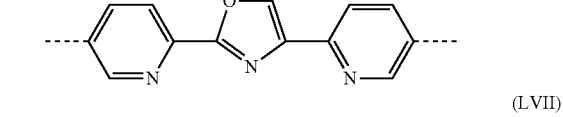
(LVII)

where the various formulae may be substituted by one or more substituents $R^{11}$ in the free positions, the symbols $R^{11}$, $Ar^{11}$, p and o have the meanings indicated above, and Y is on each occurrence, identically or differently, O, S, Se, N, P, Si or Ge.

Group 5—structural units which influence the morphological properties and/or the emission colour of the resultant polymers or compounds containing fluorine radicals in the sense of the present invention which do this job:

Besides the units mentioned above, these are those which also have at least one further aromatic or another conjugated structure which does not fall under the above-mentioned groups, i.e. which has only little influence on the charge-carrier mobility, are not organometallic complexes or have no effect on the singlet-triplet transfer. Structural elements of this type can influence the morphological properties, but also the emission colour of the resultant polymers or of the fluorine-bridged associate. Depending on the unit, they can therefore also be employed as emitters. Preference is given here to substituted or unsubstituted aromatic structures having 6 to 40 C atoms or also tolan, stilbene or bisstyrylarylene derivatives, each of which may be substituted by one or more radicals $R^{11}$. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenylene or 4,4"-bisstyrylarylene derivatives.

Very particular preference is given to substituted or unsubstituted structures of the following formulae, in which, in the case where these units are part of an oligomer or polymer, the dashed lines denote the transition to the next recurring units:

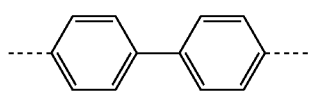
(LVIII)

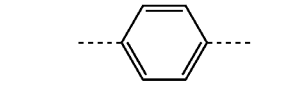
(LIX)

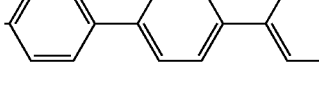
(LX)

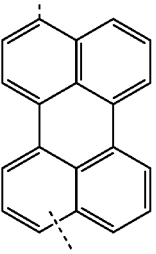
(LXI)

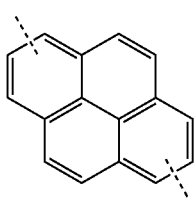
(LXII)

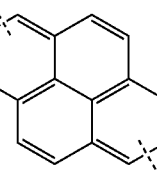
(LXIII)

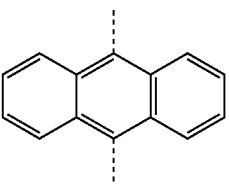
(LXIV)

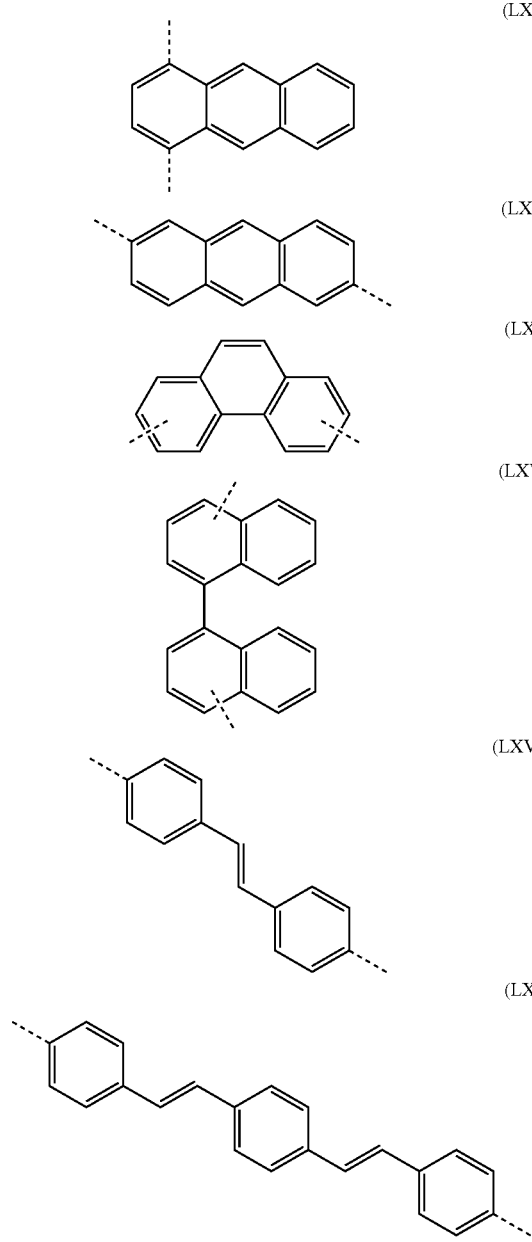

where the various formulae may be substituted by one or more substituents $R^{11}$ as defined above in the free positions.

Suitable blue-emitting units are typically units which are generally used as oligomer or polymer backbone or those which are used as blue emitters, for example as fluorinated compound according to the invention. These are generally those which have at least one aromatic or other conjugated structure, but do not shift the emission colour into the green or into the red.

Preference is given to aromatic structures having 4 to 40 C atoms, but also stilbene and tolan derivatives and certain bis(styryl)arylene derivatives. These are, for example, the following structural elements, which may be substituted or unsubstituted: 1,4-phenylene, 1,4-naphthylene, 1,4- or 9,10-anthracenylene, 2,7- or 3,6-phenanthrenylene, 4,4'-biphenylylene, 4,4''-terphenylylene, 4,4'-bi-1,1'-naphthylylene, 4,4'-stilbene derivatives, 9,10-dihydropyrene derivatives, 4,5,9, 10-tetrahydropyrene derivatives (for example in accordance with EP-A-699699), fluorene derivatives (for example in accordance with EP-A-0 842 208, WO 99/54385, WO 00/22027, WO 00/22026, WO 00/46321), spirobifluorene derivatives (for example in accordance with EP-A-0 707 020, EP-A-0 894 107, WO 03/020790, WO 02/077060), 5,7-dihydrodibenzoxepine derivatives, cis- and trans-indeno-fluorene derivatives (for example in accordance with GB 0226010 and EP 03014042) and 9,10-dihydrophenanthrene derivatives (for example in accordance with DE 10337346). Besides these classes, the so-called ladder PPPs (LPPPs) (for example in accordance with WO 92/18552), but also PPPs containing ansa structures (for example in accordance with EP-A-690086), for example, are also suitable here. Bis(styryl)arylene derivatives, which are not electron-rich, can also be used for this purpose.

It may also be preferred for more than one such blue-emitting structural unit to be used in an oligomer or polymer or a fluorine-bridged associate according to the invention.

If the oligomer or polymer or fluorine-bridged associate contains green-emitting structural units, suitable structural units for this purpose are preferably those which have at least one aromatic or other conjugated structure and shift the emission colour into the green. Preferred structures for green-emitting units are selected from the groups of the electron-rich bis-styrylarylenes and derivatives of these structures.

Further preferred green-emitting structural units are selected from the groups of the benzothiadiazoles and corresponding oxygen derivatives, the quinoxalines, the phenothiazines, the phenoxazines, the dihydrophenazines, the bis(thiophenyl)arylenes, the oligo(thiophenylenes) and the phenazines. It is also permissible here to use a plurality of different green-emitting structural units instead of one, in which case the total proportion of the green-emitting units is a maximum of 20 mol %, preferably a maximum of 10 mol % and particularly preferably a maximum of 3 mol %.

Suitable red-emitting structural units are preferably units which have at least one aromatic or other conjugated structure and shift the emission colour into the red. Preferred structures for red-emitting units are those in which electron-rich units, such as, for example, thiophene, are combined with green-emitting electron-deficient units, such as, for example, quinoxaline or benzothiadiazole. Further preferred red-emitting units are systems containing at least four condensed aromatic units, such as, for example, rubrenes, pentacenes or perylenes, which are preferably substituted, or preferably conjugated push-pull systems (systems which are substituted by donor and acceptor substituents) or systems such as squarines or quinacridones, which are preferably substituted. It is also permissible here to use a plurality of red-emitting units instead of one, in which case the total proportion of the red-emitting units is a maximum of 10 mol %, preferably a maximum of 5 mol % and particularly preferably a maximum of 1 mol %.

Suitable blue-, green- and red-emitting structural units are in principle also units which emit light from the triplet state, i.e. exhibit electrophosphorescence instead of electrofluorescence, which frequently causes an increase in the energy efficiency. These units are referred to as triplet emitters below. The use of metal complexes of this type in low-molecular-weight OLEDs is described, for example, in M. A. Baldo et al. (*Appl. Phys. Lett.* 1999, 75, 4-6).

Suitable for this purpose are firstly compounds which contain heavy atoms, i.e. atoms from the Periodic Table of the Elements having an atomic number of greater than 36.

Particularly suitable for this purpose are compounds which contain d and f transition metals which meet the above-mentioned condition. Very particular preference is given here to corresponding structural units which contain elements from groups 8 to 10 (i.e. Ru, Os, Rh, Ir, Pd, Pt).

Suitable structural units for the polymers according to the invention are, for example, various complexes, which are described, for example, in WO 02/068435, DE 10116962 A1, EP 1239526 and DE 10238903 A1.

Corresponding compounds are described in WO 02/068435.

The colours of the complexes here are determined primarily by the metal used, by the precise ligand structure and by the substituents on the ligand. Both green- and red-emitting complexes are known. Thus, for example, an unsubstituted tris(phenylpyridyl)iridium(III) emits green light, while electron-donating substituents in the para-position to the coordinating carbon atom (for example diarylamino substituents) shift the emission into the orange-red. Also known are derivatives of this complex with a varied ligand structure which result directly (without further substitutions) in orange or deep-red emission. Examples of such ligands are 2-phenyl-isoquinoline, 2-benzo-thiophenylpyridine and 2-naphthylpyridine.

Blue-emitting complexes are obtained, for example, by substituting the tris(phenylpyridyl)iridium(III) skeleton by electron-withdrawing substituents, such as, for example, a plurality of fluorine and/or cyano groups.

The structural units described above are substituted by the fluorine radicals in accordance with the present invention in such a way that the desired fluorine-bridged associate can be obtained. The synthesis techniques for the preparation of such structural units substituted by fluorine radicals are known to the person skilled in the relevant art.

Specific examples of the functional compounds containing a fluorine radical which can be employed in the fluorine-bridged associate according to the invention are indicated below.

Preferred fluorescent emitters as compounds containing at least one fluorine radical of the present invention are selected from the class of the monostyrylamines, the distyrylamines, the tristyrylamines, the tetrastyrylamines and the arylamines, each of which are substituted by at least one fluorine radical. A monostyrylamine is taken to mean a compound which contains one styryl group and at least one amine, which is preferably aromatic. A distyrylamine is taken to mean a compound which contains two styryl groups and at least one amine, which is preferably aromatic. A tristyrylamine is taken to mean a compound which contains three styryl groups and at least one amine, which is preferably aromatic. A tetrastyrylamine is taken to mean a compound which contains four styryl groups and at least one amine, which is preferably aromatic. An arylamine or an aromatic amine in the sense of the present invention is taken to mean a compound which contains three aromatic or heteroaromatic ring systems bonded directly to the nitrogen, at least one of which is preferably a condensed ring system having at least 14 aromatic ring atoms. The styryl groups are particularly preferably stilbenes, which may also be further substituted on the double bond or on the aromatic rings. Examples of compounds of this type are substituted or unsubstituted tristilbenamines or further compounds which are described, for example, in WO 06/000388, WO 06/058737, WO 06/000389, DE 102005058543 A1 and DE 102006015183 A1. Preference is furthermore given to compounds in accordance with WO 06/122630 and in accordance with DE 102006025846 A1 as emitters.

A phosphorescent emitter compound is preferably selected from the class of the metal complexes containing at least one element having an atomic number of greater than 20, preferably greater than 36 and less than 84, particularly preferably greater than 56 and less than 80. Preference is given to the use of metal complexes which contain copper, molybdenum, tungsten, rhenium, ruthenium, osmium, rhodium, iridium, palladium, platinum, silver, gold or europium, in particular iridium. In general, phosphorescent materials, as are used in accordance with the prior art, are suitable for this purpose.

Group 6—structural units which modify the emission characteristics to such an extent that electrophosphorescence can be obtained instead of electro-fluorescence or compounds containing fluorine radicals in the sense of the present invention which do this job:

These are, in particular, structural units which, even at room temperature, are able to emit light from the triplet state, i.e. exhibit electrophosphorescence instead of electrofluorescence, with high efficiency, which frequently causes an increase in the energy efficiency. Suitable for this purpose are firstly compounds which contain heavy atoms having an atomic number of greater than 36. Particularly suitable are compounds which contain d or f transition metals which meet the above-mentioned condition. Very particular preference is given here to corresponding structural units which contain elements from groups 8 to 10 (Ru, Os, Rh, Ir, Pd, Pt). Suitable structural units for the polymers here are, for example, various complexes which are described, for example, in WO 02/068435, WO 02/081488, EP 1239526 and WO 04/026886. Corresponding monomers are described in WO 02/068435 and WO 2005/042548 A1.

Preferred structural units from group 6 are those of the following formulae:

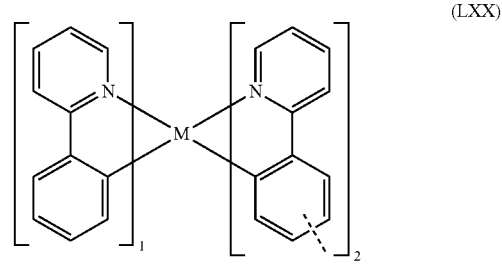
(LXX)

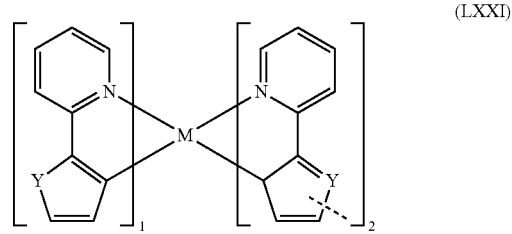
(LXXI)

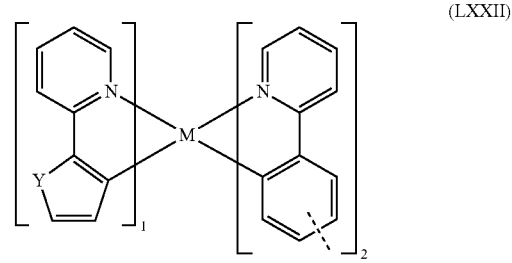
(LXXII)

(LXXIII)
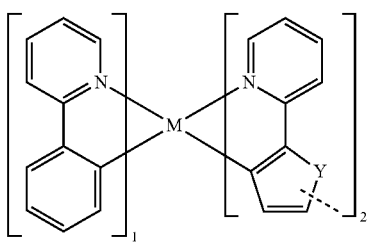

(LXXIV)
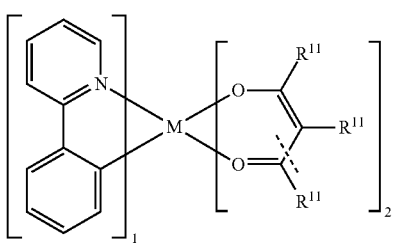

(LXXV)
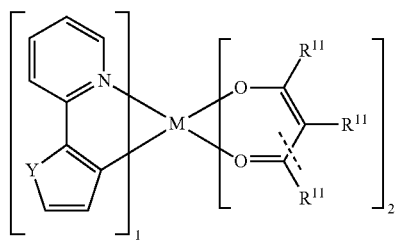

(LXXVI)
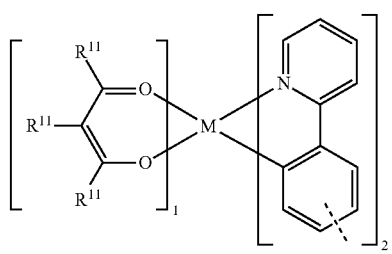

(LXXVII)
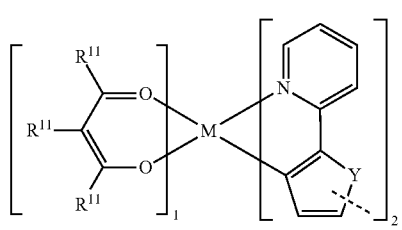

in which M stands for Rh or Ir, Y has the meaning indicated above, and the various formulae may be substituted by one or more substituents $R^{11}$ as defined above in the free positions.

Group 7—structural units which improve the transfer from the singlet state to the triplet state or compounds containing fluorine radicals in the sense of the present invention which do this job:

These are, in particular, structural units which improve the transfer from the singlet state to the triplet state and which, employed in support of the structural elements from group 6, improve the phosphorescence properties of these structural elements. Suitable for this purpose are, in particular, carbazole and bridged carbazole dimer units, as described, for example, in WO 04/070772 and WO 04/113468. Also suitable for this purpose are ketones, phosphine oxides, sulfoxides and similar compounds, as described, for example, in WO 2005/040302 A1.

It is also possible for more than one structural unit from one of groups 1 to 7 to be present simultaneously.

The polymer may furthermore likewise contain metal complexes, which are generally built up from one or more ligands and one or more metal centres, bonded into the main or side chain. The compounds containing fluorine radicals may also originate from this class.

Preference is given to polymers which additionally also contain one or more structural units selected from groups 1 to 7. Preference is furthermore given to fluorine-bridged associates which additionally also contain one or more structural units selected from groups 1 to 7.

It is likewise preferred for the polymers or the fluorine-bridged associate to contain structural units which improve the charge transport and/or charge injection, i.e. structural units from group 2 and/or 3; a proportion of 1 to 30 mol % of these structural units is particularly preferred; a proportion of 2 to 10 mol % of these structural units is very particularly preferred.

It is furthermore particularly preferred for the polymers or the fluorine-bridged associate to contain structural units from group 1, structural units from group 2 and/or 3 and structural units from group 5.

The polymers preferably contain 10 to 10,000, particularly preferably 20 to 5000 and in particular 50 to 2000, recurring units. The fluorinated oligomers according to the invention, which contain 3 to 9 recurring units, should be differentiated therefrom. Otherwise, the oligomers can also contain all recurring units defined above, including the emitters.

The requisite solubility of the polymers is ensured, in particular, by the substituents on the various recurring units.

The polymers may be linear, branched or crosslinked. The copolymers according to the invention may have random, alternating or block-like structures or also have a plurality of these structures in an alternating arrangement. The way in which copolymers having block-like structures can be obtained and what further structural elements are particularly preferred for this purpose is described in detail, for example, in WO 2005/014688. This specification is incorporated into the present application by way of reference.

The polymers are generally prepared by polymerisation of one or more types of monomer. Suitable polymerisation reactions are known to the person skilled in the art and are described in the literature. Particularly suitable and preferred polymerisation and coupling reactions, all of which result in C—C links, are those according to SUZUKI, YAMAMOTO, STILLE, HECK, NEGISHI, SONOGASHIRA or HIYAMA.

The way in which the polymerisation can be carried out by these methods and the way in which the polymers can then be separated off from the reaction medium and purified is known to the person skilled in the art and is described in detail in the literature, for example in WO 2003/048225 and WO 2004/037887.

The C—C linking reactions are preferably selected from the group of the SUZUKI coupling, the YAMAMOTO coupling and the STILLE coupling.

For the synthesis of the polymers, the corresponding monomers are required. The synthesis of structural units from groups 1 to 7 is known to the person skilled in the art and is described in the literature, for example in WO 2005/014689. This and the literature cited therein is incorporated into the present application by way of reference. In order to obtain the fluorinated polymers according to the invention, a corresponding monomer can be copolymerised with a fluorinated monomer.

It may additionally be preferred to use the polymer not as the pure substance, but instead as a mixture (blend) together with further polymeric, oligomeric, dendritic or low-molecular-weight substances of any desired type. These may, for example, improve the electronic properties or emit themselves. Such blends are therefore also part of the present invention.

The invention furthermore relates to solutions and formulations comprising one or more fluorine-bridged associates according to the invention or precursors thereof, i.e. fluorine-containing polymers or blends and small molecules (fluorinated) and/or monomers (fluorinated), in one or more solvents. The way in which solutions of this type can be prepared is known to the person skilled in the art and is described, for example, in WO 02/072714, WO 03/019694 and the literature cited therein. The solutions and formulations may optionally comprise one or more additives.

These solutions can be used, for example, in a process for the production of thin layers (or polymer layers, or layers of small molecules) of the fluorine-bridged associate, for example by area-coating methods (for example spin coating) or by printing processes (for example ink-jet printing).

Furthermore, an opto-electronic device which comprises a cathode, an anode and a layer, where the layer comprises a fluorine-bridged associate according to the invention, is provided in accordance with the invention.

In particular, the opto-electronic device in which the fluorine-bridged associate of the present invention is employed is, in accordance with the invention, an organic or polymeric light-emitting diode, an organic solar cell (O-SC, for example WO 98/48433, WO 94/05045), an organic field-effect transistor (O-TFT), an organic integrated circuit (O-IC, for example WO 95/31833, WO 99/10939), an organic field-quench element (FDQ, for example US 2004/017148), an organic optical amplifier, an organic photo-receptor, an organic photodiode or an organic laser diode (O-laser, for example WO 98/03566).

The device is correspondingly structured, provided with contacts and finally hermetically sealed in a manner known per se, depending on the application, since the lifetime of devices of this type is drastically shortened in the presence of water and/or air. It may also be preferred here to use a conductive, doped polymer as electrode material for one or both of the electrodes (electrode and counterelectrode or anode and cathode) and not to introduce an interlayer comprising conductive, doped polymer.

For applications in O-FETs and O-TFTs, it is additionally necessary for the structure, in addition to the electrode and counterelectrode (source and drain), also to comprise a further electrode (gate), which is separated from the organic semiconductor by an insulator layer, having a generally high (or rarely low) dielectric constant. In addition, it may be appropriate to introduce further layers into the device.

For the purposes of this invention, the electrodes are selected so that their potential agrees as closely as possible with the potential of the adjacent organic layer in order to ensure the most efficient electron or hole injection possible.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this dielectric layer is preferably between 1 and 10 nm.

The anode preferably comprises materials having a high work function. The anode preferably has a potential of greater than 4.5 eV versus vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to enable either the irradiation of the organic material (O-SCs) or the coupling-out of light (OLEDs/PLEDs, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive, doped polymers.

The invention is explained in greater detail below with reference to working examples, which should not be regarded as restrictive.

WORKING EXAMPLES

Examples 1 and 2

Preparation of the Polymers

Polymer P1 according to the invention and comparative polymer C1 are synthesised using the following monomers (per cent data=mol %) by SUZUKI coupling in accordance with WO 03/048225 A2.

Example 1
Polymer P1
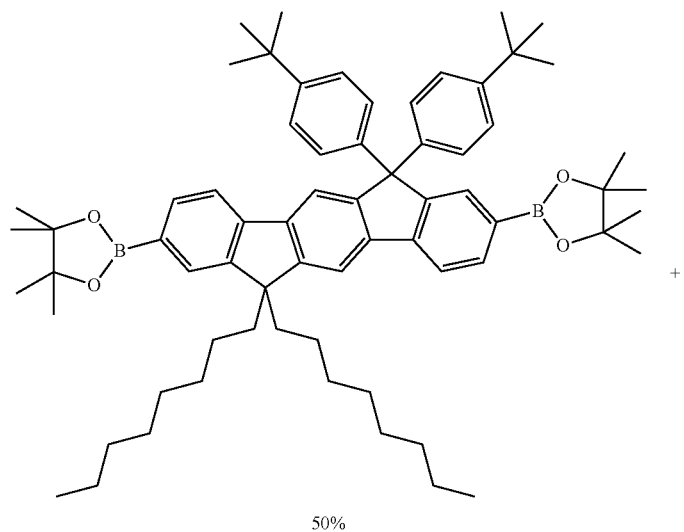
50%
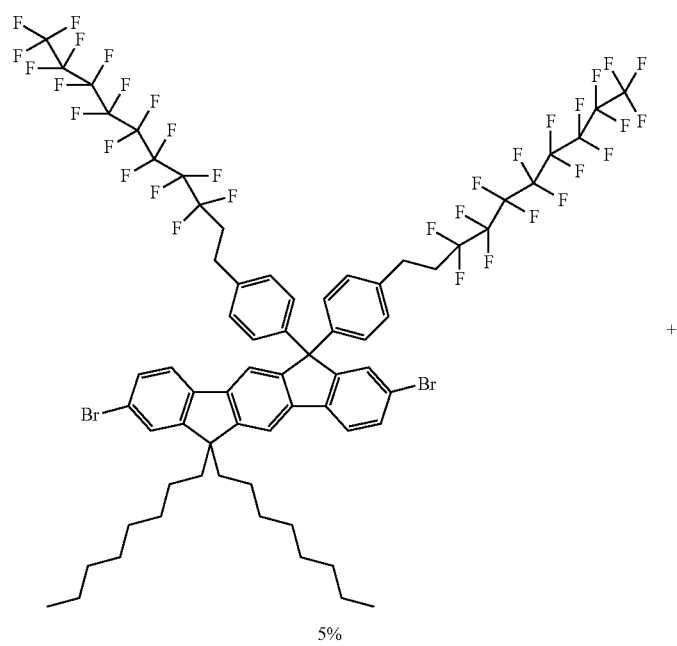
5%

-continued

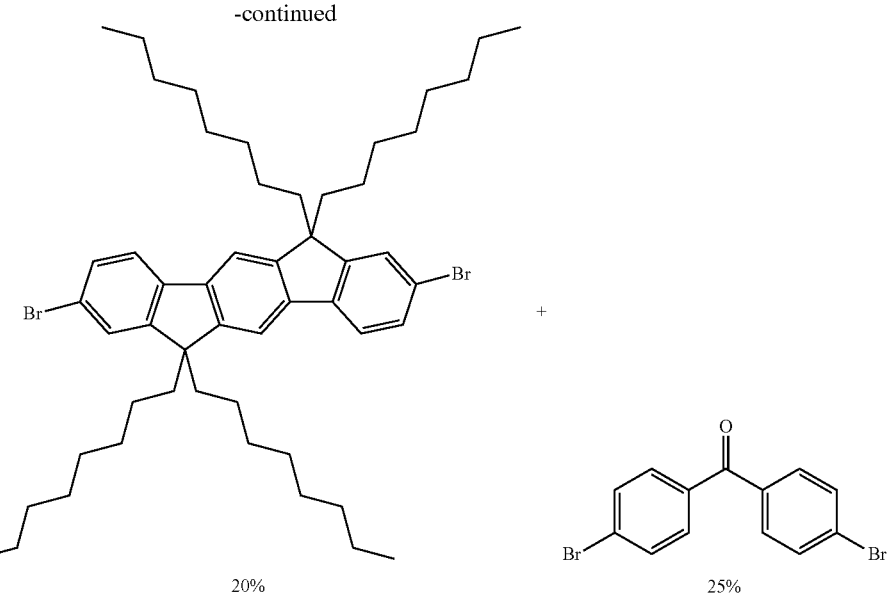

20%

25%

Example 2

Polymer C1

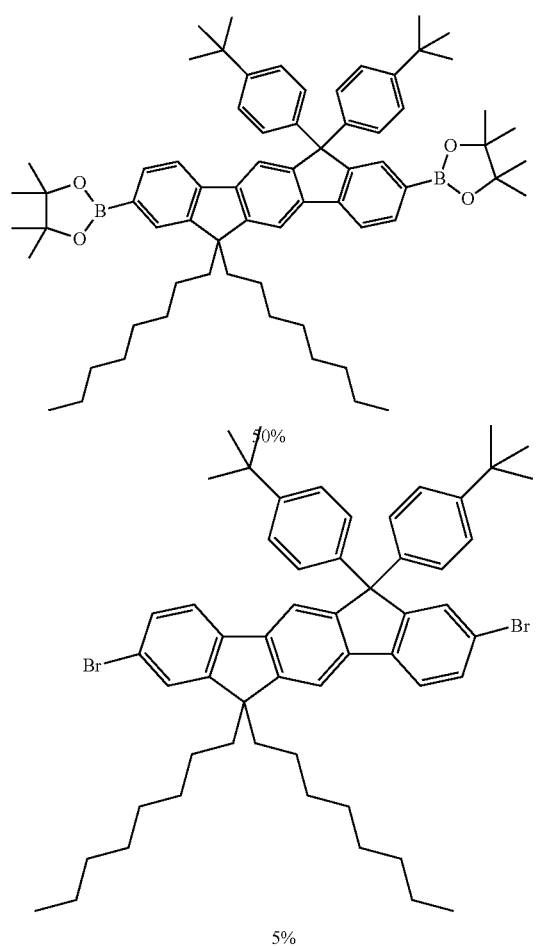

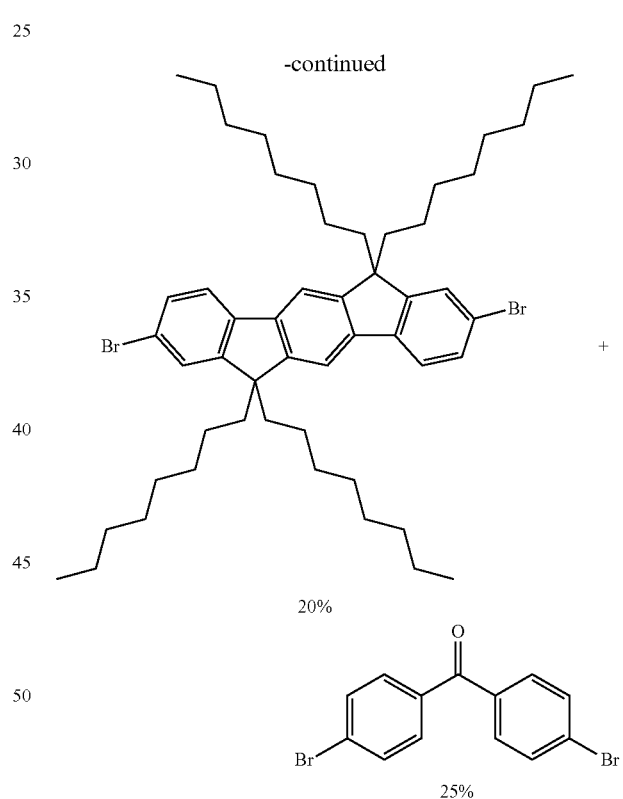

20%

25%

Examples 3 and 4

Production and Measurement of Emitting Layers

Solutions of polymers P1 and C1 with emitters T1 and T2 according to the invention are prepared in high-purity, dry and oxygen-free toluene. The concentrations are in each case 8% by weight of the emitter, based on the polymer, and the total sample weights are 12.5 mg/ml (i.e. 1 mg/ml of T1 or T2 and 11.5 mg/ml of P1 or C1). Films having a layer thickness of 80 nm are produced therefrom by spin coating on quartz specimen slides and are subsequently measured in a PL spectrometer with nitrogen-flooded sample space (Hitachi F-4500 fluorescence spectrometer). A measure of efficient transfer of excitation energy and thus also of an exciton generated by recombination in an OLED from the polymer to the emitter is the ratio of residual emission of the polymer to the emitter emission in such a film.

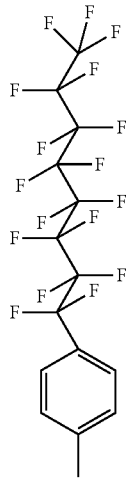

T1

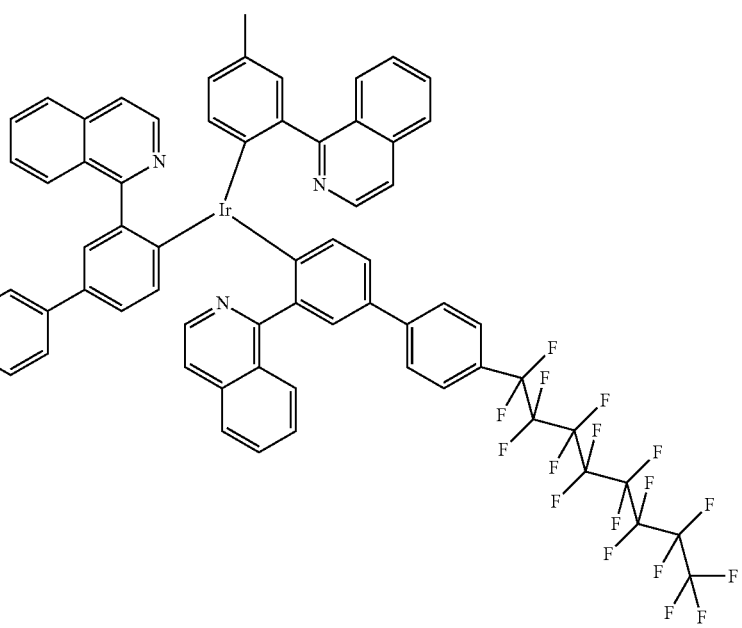

-continued

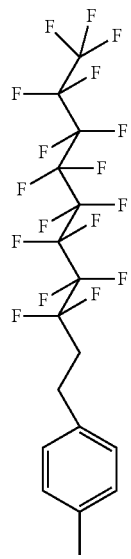

T2

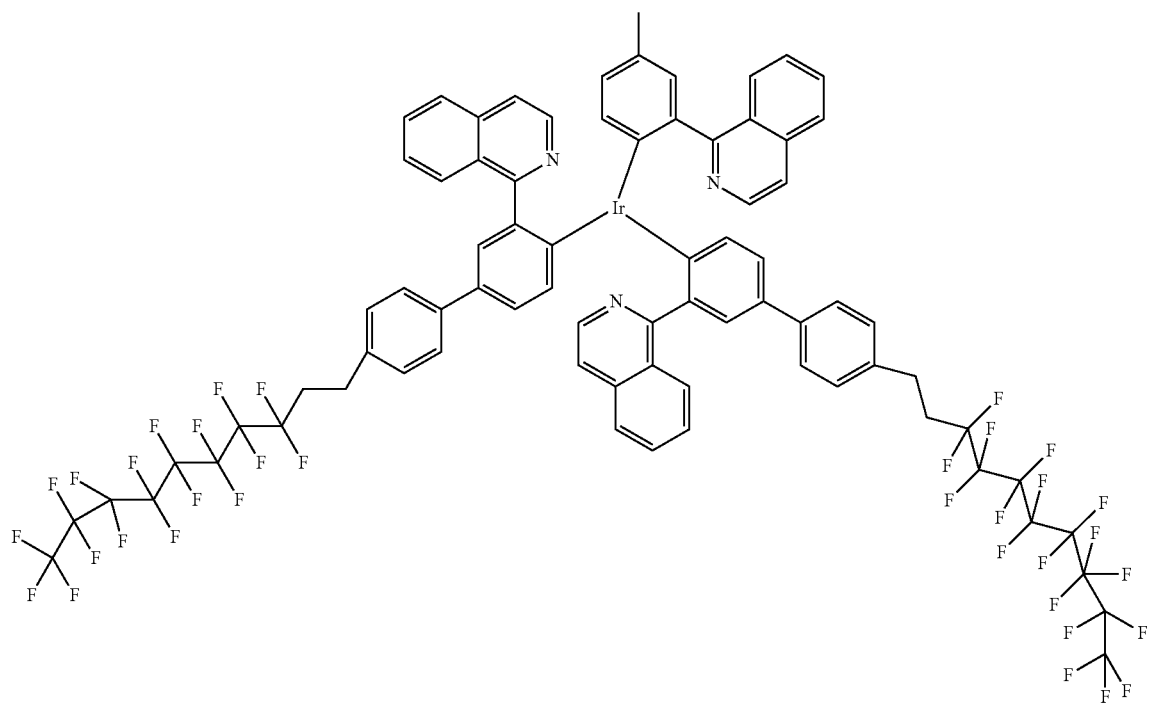

Figure 2:
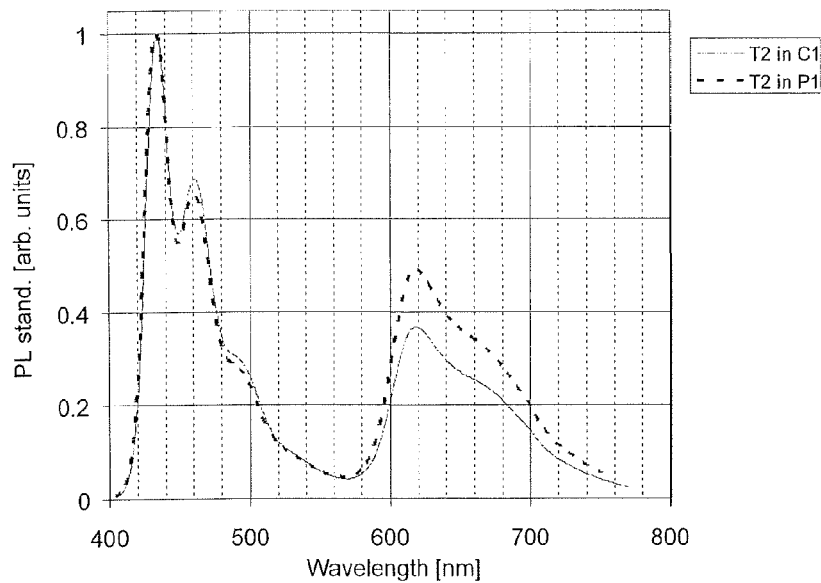
FIG. 2 shows the spectra of T2 in P1 and T2 in C1.

FIG. 1 shows the spectra of T1 in P1 and T1 in C1, FIG. 2 shows the spectra of T2 in P1 and T2 in C1. The excitation wavelength is in each case at the absorption maximum of the polymer at 395 nm. In both cases, the spectra show a higher red fraction for the likewise fluorinated matrix P1, i.e. the transfer of the excitation energy functions better with the aid of the F-F interaction.

Table 1 summarises the results calculated from the standardised spectra and, for reasons of simplicity, from the ratio of the maxima.

TABLE 1

| Composition | Red/blue ratio | Red/blue |
|---|---|---|
| T1 in P1 | 1:0.6 | 1.67 |
| T1 in C1 | 0.95:1 | 0.95 |
| T2 in P1 | 0.48:1 | 0.48 |
| T2 in C1 | 0.37:1 | 0.37 |

The invention claimed is:
1. A fluorine-bridged associate consisting of
an oligomer or polymer containing fluorine radicals which are bonded to the oligomer or polymer backbone, and up to three types of functional units in the backbone which differ with respect to function and are selected from the group consisting of a hole-transport and/or hole-injection unit, an electron-transport and/or electron-injection unit and an emitter unit, and one to three types of compounds containing a fluorine radical which differ with respect to function and are selected from a hole-transport and/or hole-injection unit, an electron-transport and/or electron-injection unit and an emitter unit wherein the fluorine radicals have the general formula $C_xH_yF_z$, where x≥1, y≥0 and z≥1, and no, one or more $CH_2$ groups, which may also be adjacent, may be replaced by O, S, Se, Te, $Si(R^1)_2$, $Ge(R^1)_2$, $NR^1$, $PR^1$, CO, $P(R^1)O$, where $R^1$ is on each occurrence, identically or differently, a straight-chain, branched or cyclic alkyl, alkenyl, alkynyl, aryl, arylalkyl, arylalkenyl, arylalkynyl, heteroaryl or heteroalkyl group, where, in addition, one or more non-adjacent C atoms in the non-aromatic moieties may be replaced by O, S, COO, OCO, with the proviso that two radicals $R^1$ may also form ring systems with one another, the emitter unit is a triplet emitter which contains Ru, Os, Ir, Pd or Pt, the oligomer or polymer backbone contains an electron-transport and/or electron-injection unit and the fluorine-bridged associate contains a hole-transport and/or hole-injection unit and/or an emitter unit as compound(s) containing a fluorine radical, the oligomer or polymer backbone contains a hole-transport and/or hole-injection unit and an electron-transport and/or electron-injection unit and the fluorine-bridged associate contains an emitter unit as compound(s) containing a fluorine radical, or the oligomer or polymer backbone contains a hole-transport and/or hole-injection unit and an emitter unit and the fluorine-bridged associate contains an electron-transport and/or electron-injection unit as compound(s) containing a fluorine radical, and wherein the electron-transport and/or electron-injection unit is selected from the group consisting of optionally substituted pyridines, pyrimidines, pyridazines, pyrazines, pyrenes, perylenes, anthracenes, benzanthracenes, oxadiazoles, quinolines, phenazines, benzimidazoles, ketones, phosphine oxides, sulfoxides, triazines, triarylboranes, and benzophenone.

2. The fluorine-bridged associate according to claim 1, wherein the oligomer or polymer is a non-conjugated, partially conjugated or conjugated homo- or co-oligomer or -polymer.

3. The fluorine-bridged associate according to claim 1, wherein the oligomer or polymer contains a spacer between the oligomer or polymer backbone and the fluorine radicals.

4. A formulation comprising the fluorine-bridged associate of claim 1 or a precursor thereof together with one or more solvents.

5. An optoelectronic device comprising a cathode, an anode and a layer comprising the fluorine-bridged associate of claim 1.

6. The opto-electronic device of claim 5, wherein the opto-electronic device is an organic or polymeric light-emitting diode, an organic solar cell, an organic field-effect transistor, an organic thin-film transistor, an organic integrated circuit, an organic field-quench element, an organic optical amplifier, an organic photoreceptor, an organic photodiode or an organic laser diode.

* * * * *